United States Patent
Sheu et al.

(10) Patent No.: US 8,040,723 B2
(45) Date of Patent: Oct. 18, 2011

(54) VOLTAGE COMPENSATION CIRCUIT, MULTI-LEVEL MEMORY DEVICE WITH THE SAME, AND VOLTAGE COMPENSATION METHOD FOR READING THE MULTI-LEVEL MEMORY DEVICE

(75) Inventors: Shyh-Shyuan Sheu, Hsinchu County (TW); Pei-Chia Chiang, Taipei (TW); Wen-Pin Lin, Changhua County (TW); Chih-He Lin, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 140 days.

(21) Appl. No.: 12/650,544

(22) Filed: Dec. 31, 2009

(65) Prior Publication Data
US 2011/0122684 A1 May 26, 2011

(30) Foreign Application Priority Data
Nov. 20, 2009 (TW) .............................. 98139567 A

(51) Int. Cl.
*G11C 7/00* (2006.01)
(52) U.S. Cl. .................... 365/163; 365/148; 365/189.09
(58) Field of Classification Search .................. 365/163, 365/148, 189.09, 189.11, 210.1, 185.2, 185.21
See application file for complete search history.

(56) References Cited

U.S. PATENT DOCUMENTS

| | | | |
|---|---|---|---|
| 6,009,022 A * | 12/1999 | Lee et al. ................. | 365/189.09 |
| 7,639,522 B2 * | 12/2009 | Cho et al. ................. | 365/148 |
| 7,830,705 B2 * | 11/2010 | Jeong ....................... | 365/163 |
| 2008/0266942 A1 | 10/2008 | Jeong et al. | |
| 2008/0316802 A1 | 12/2008 | Happ et al. | |
| 2009/0003033 A1 | 1/2009 | Nirschl | |
| 2009/0016100 A1 | 1/2009 | Jeong | |
| 2010/0157672 A1 * | 6/2010 | Barkley .................... | 365/185.03 |

* cited by examiner

*Primary Examiner* — Gene N Auduong
(74) *Attorney, Agent, or Firm* — Jianq Chyun IP Office

(57) ABSTRACT

A voltage compensation circuit, a multi-level memory device with the same, and a voltage compensation method for reading the multi-level memory device are provided. When a memory cell is read, a reference voltage applied to the memory device is adjusted according to variation of characteristics of a drift resistance of a reference cell. The increased value of the reference voltage (i.e. a voltage difference) corresponds to a resistance variation caused by a drift condition. The drift compensation mechanism is adaptive to a compensation circuit of a read driver of the memory device, which can compensate variation of the voltage level when data is read from the memory cell. When the resistance drift occurs, a drift amount is calculated and is added to the reference voltage, in order to avoid the error in judgement caused by the resistance drift when the stored data is read out.

18 Claims, 11 Drawing Sheets

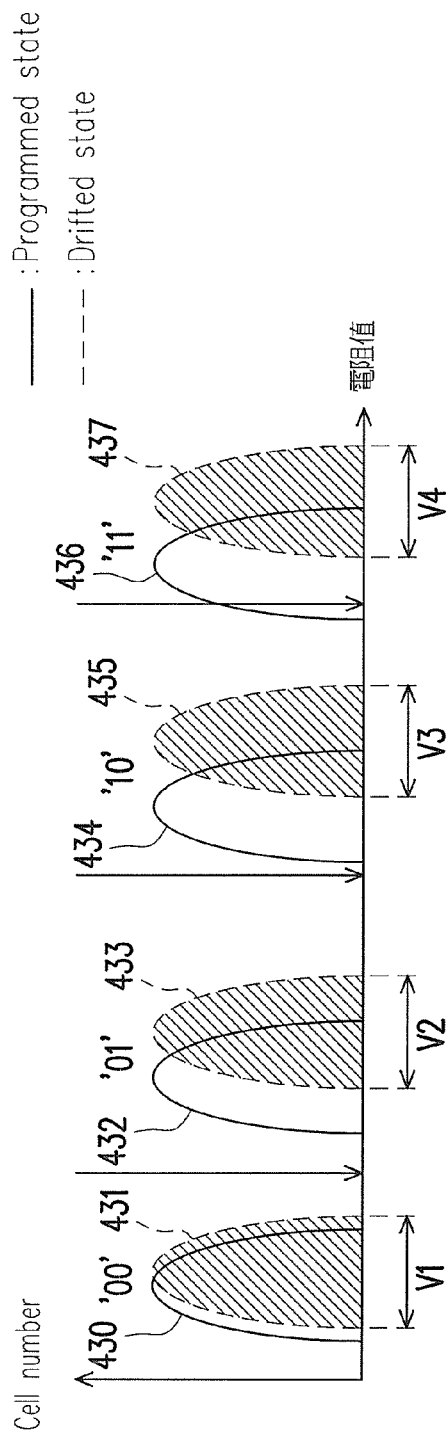
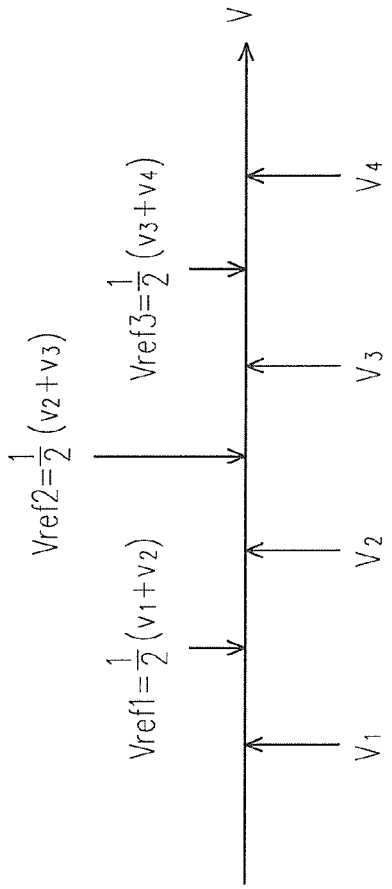
FIG. 4B (RELATED ART)
FIG. 4C (RELATED ART)

VOLTAGE COMPENSATION CIRCUIT, MULTI-LEVEL MEMORY DEVICE WITH THE SAME, AND VOLTAGE COMPENSATION METHOD FOR READING THE MULTI-LEVEL MEMORY DEVICE

CROSS-REFERENCE TO RELATED APPLICATION

This application claims the priority benefit of Taiwan application serial no. 98139567, filed on Nov. 20, 2009. The entirety of the above-mentioned patent application is hereby incorporated by reference herein and made a part of specification.

BACKGROUND OF THE INVENTION

1. Field of the Invention

The present invention relates to a voltage compensation circuit, a multi-level memory device with the same, and a voltage compensation method for reading the multi-level memory device.

2. Description of Related Art

With development of portable electronic devices, demand for non-volatile memory is gradually increased. Since a phase change memory (PCM) technique has competitive characteristics of speed, power, capacity, reliability, process integration and cost, etc., it is regarded as a most promising next-generation non-volatile memory technique.

Regarding an operation of the PCM, two different currents are applied to the PCM, so that due to an ohm heating effect, different temperature variations of local regions of the PCM can cause a reversible phase transition of an amorphous state and a crystalline state of the phase change material, and such two phase change structures can present different resistances to achieve a purpose of storing data.

To convert the phase change material from the amorphous state to the crystalline state, an electrode of the PCM where the current is applied is suitably heated, so that the phase change material is heated to exceed a temperature to crystallize, and such operation is generally referred to as a SET operation. Similarly, to convert the phase change material from the crystalline state to the amorphous state, a current pulse is suitably applied to the PCM, so that the phase change material is heated to exceed a temperature to melt, and the amorphous state is obtained through a rapid cooling process. Such operation is generally referred to as a RESET operation. Based on the reversible phase transition of the amorphous state and the crystalline state of the phase change material, data storage can be achieved.

FIG. 1 is a schematic diagram illustrating current pulses used for writing and reading a PCM. When the RESET operation of the PCM is performed, a reset current $I_{RESET}$ with a short pulse width and a high pulse height is applied, so that a temperature of a local region of the PCM is higher than a melting temperature ($T_m$), and the local region is melted. When the melted local region is instantly cooled, since there is no enough time for re-crystallization, the amorphous state of the phase change material is formed during the cooling process, and now the phase change material has a high resistance. On the other hand, when the SET operation of the PCM is performed, a set current $I_{SET}$ with a wide pulse width and a low pulse height is applied, so that a temperature of the local region of the PCM is between a crystalline temperature ($T_C$) and the melting temperature ($T_m$) of the phase change material, and the amorphous region can be recrystallized after the SET operation.

As described above, the RESET operation and the SET operation of the PCM are equivalent to a write operation and an erase operation of a memory, and a memory effect can be achieved based on a resistance variation generated by operating the PCM between the crystalline state to the amorphous state. When data of the PCM is read, a read current $I_{READ}$ with a current value less than $I_{SET}$ is applied to determine the resistance, so as to obtain the stored data.

FIG. 2 is a schematic diagram illustrating a conventional SET signal of a PCM. The SET signal includes a first crystallization current pulse $I_{SET1}$ and a second crystallization current pulse $I_{SET2}$. The first crystallization current pulse $I_{SET1}$ has a first current peak $I_{P1}$, and a hold time of the first current peak $I_{P1}$ is a first hold time $t_1$. The second crystallization current pulse $I_{SET2}$ has a second current peak $I_{P2}$, and a hold time of the second current peak $I_{P2}$ is a second hold time $t_2$.

Regarding the conventional SET signal, a combination of two different current pulses is used to perform the SET operation. Under a pulse function of the higher first current peak $I_{P1}$ with a shorter first hold time $t_1$, a local region crystallization of the phase change material is first accomplished. Then, under a pulse function of the lower second current peak $I_{P2}$ with a longer second hold time $t_2$, a complete crystallization of the phase change material is achieved. According to such operation method of crystallization, a characteristic of stable reliability can be achieved, which also avails improving a uniformity of component distribution.

The aforementioned PCM has advantages of low power consumption, small area and fast operation speed, etc., and regarding a R-ratio of the PCM resistance, RESET is 10M-1M, and SET is 10K, so that R-ratio is 10M-1M/10K, which is closed to 1000-100 times, even reaches 1000 times. Since the R-ratio is great enough, in recent years, the world's major manufactures start to develop multi-level PCMs to replace flash memories. However, in recent published documents, when the PCM is not operated for a period of time, the high-impedance state resistance thereof is increased due to a long idle time, and such characteristic can cause a problem of read error for a multi-level and high-impedance state read operation. Therefore, a compensation mechanism is required to resolve the error in judgement.

A U.S. Patent No. 2008/0266942 provides a multi-level PCM device, in which an operation of pre-reading operation resistance drift recovery can be performed. As shown in FIG. 3A, to compensate the resistance drift, during a write operation, a compensation current $I_{Sense}$ of a sensor amplifier circuit (SA) 310 and a recovery current $I_{Recovery}$ of a write driver (WD) 320 are used to perform the write operation to a bit line (BL) through an address selector 330, which is a write mechanism for compensating the resistance drift. As shown in FIG. 3B, the SA 310 is coupled to a phase change random access memory (PRAM) cell array 340 through the address selector 330 and the bit line. A circuit 350 provides a read current to the PRAM cell array 340, and obtains an output voltage to the SA 310 for determination. Therefore, during the write operation, the write current is compensated according to the resistance drift.

A U.S. Patent No. 2009/0016100 also provides a multi-level PCM device. Referring to FIG. 4A, the multi-level phase change memory device includes a main region 410 and a reference region 412 of a memory array region, a sensor amplifier circuit (shown as "SA" in FIG. 4A) 414, a reference voltage generator 416, a write driver (shown as "WD" in FIG. 4A) 418, an input/output buffer 420, a control circuit 422 and an address decoder 424.

As shown in FIG. 4, the reference voltage generator 416 generates a reference voltage Vref to the SA 414 for determination. A method that the reference voltage generator 416 generates the reference voltage Vref is shown as FIG. 4B and FIG. 4C. Original programmed states are 430, 432, 434 and 436, and drifted states are 431, 433, 435 and 437. Regarding reference voltages required by the multi-level PCM, voltages V1, V2, V3 and V4 of reference memory cells (RMC) are directly used to generate new reference voltages Vref1, Vref2, Vref3 and Vref4, and values of the reference voltages Vref1, Vref2 and Vref3 are respectively 1/2(V1+V2), 1/2(V2+V3), 1/2(V3+V4), which are provided to the SA 414 for determination.

Referring to FIG. 5, a U.S. Patent No. 2009/0003033 discloses a read method for a PCM. With respect to charge time of the bit line (shown as "BL" in FIG. 5), in different states, corresponding values of charged voltage of the BL and charge time are different, which has situations of 1-5 nanosecond (ns), and such method is not applied to a multi-level read operation and a compensation application thereof.

A U.S. Patent No. 2008/0316802 discloses a memory device having a drift compensation function and an operation method thereof. Referring to FIG. 6, when a memory array having the drift characteristics is read, a drift condition sensor system first performs a compensation detection, and then the reference voltage is modified according to a detected drift condition, as that shown in FIG. 6. However, in such patent, how to perform the compensation is not described, and a detail circuit thereof is not provided. Moreover, such patent is adapted to a read circuit having a compensation effect.

SUMMARY OF THE INVENTION

A memory device having a compensation circuit is provided. After the memory device is activated, a compensation voltage is generated according to information of a resistance varied along with time that is provided by a reference cell, and the compensation voltage is applied to a reference voltage provided from external for compensation. The compensated reference voltage may be used to read data stored in data cells of the memory device.

In one exemplary embodiment, a memory device comprises a plurality of data cells, a plurality of reference cells, multiple pairs of bit lines, an address decoder, a compensation circuit and a sensor amplifier circuit. The data cells are arranged in an array, and are used for storing multi-level data. Each pair of bit lines corresponds to one data cell, in which each pair of bit lines comprises a data bit line and a reference bit line, and the data bit line is connected to the data cell. The address decoder receives an address signal, and performs decoding according to the address signal, and accordingly selects one of the data cells and the corresponding reference cell. The compensation circuit is connected to the selected reference cell, in which the reference cell is used for providing information of resistance varied along with time. The compensation circuit generates a compensation voltage according to the information provided by the reference cell, and the compensation voltage may be used to apply to the reference voltage, thereby a result as the stored data of the data cell is sensed according to the reference voltage compensated by the compensation voltage.

In one exemplary embodiment, a voltage compensation method for reading a multi-level memory device. A power supply is provided to activate the multi-level memory device to perform reading. One of the data cells is selected to read stored data, and one of the reference cells is correspondingly selected. A current passing through the reference cell is mapped to generate a first current for coupling to a comparison terminal. A reference voltage control switch is turned on to generate a second current when the reading is to be performed. The second current is mapped to generate a third current, and the third current is mapped to generate a fourth current for coupling to the comparison terminal, in which the comparison terminal is coupled to a voltage compensation switch. When the first current is less than the fourth current, the voltage compensation switch is turned on, and a voltage difference is compensated to a reference voltage corresponding to the data cell to be read.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 4B and 4C are schematic diagrams respectively illustrating a resistance drift phenomenon of a multi-level PCM device of FIG. 1 and calculation of reference voltages for compensating the resistance drift.

DESCRIPTION OF THE EMBODIMENTS

Figure 1:
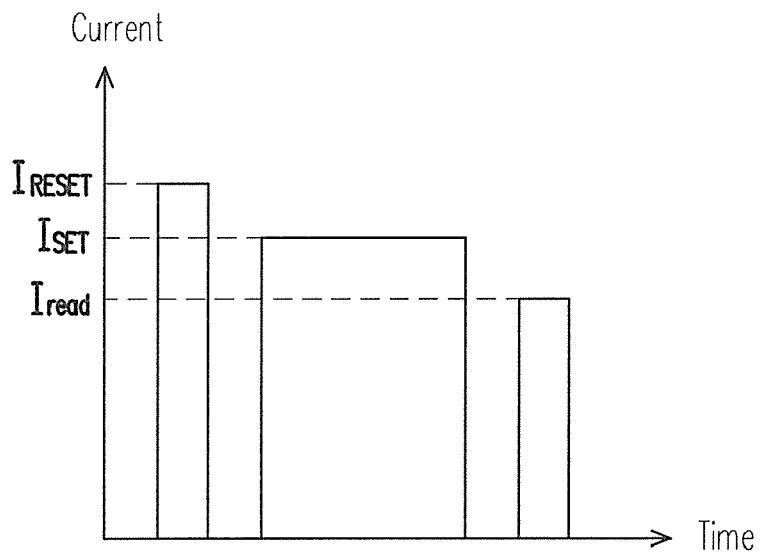
FIG. 1 is a schematic diagram illustrating current pulses used for writing and reading a PCM.
Figure 2:
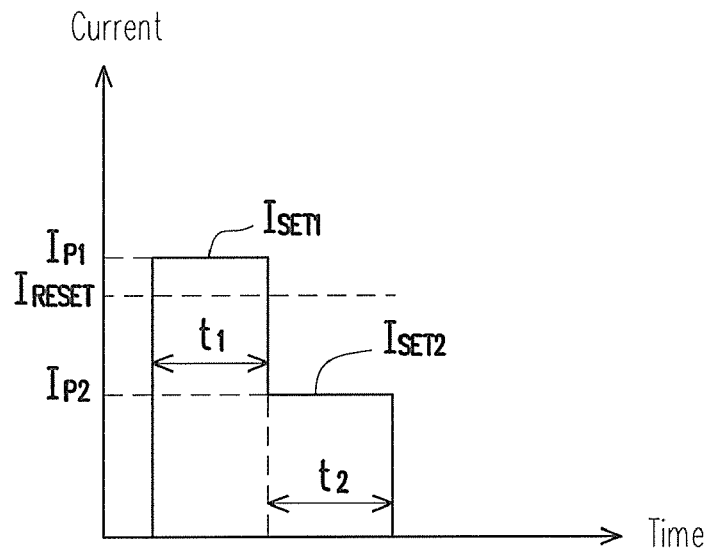
FIG. 2 is a schematic diagram illustrating a conventional SET signal of a PCM.
Figure 3A:
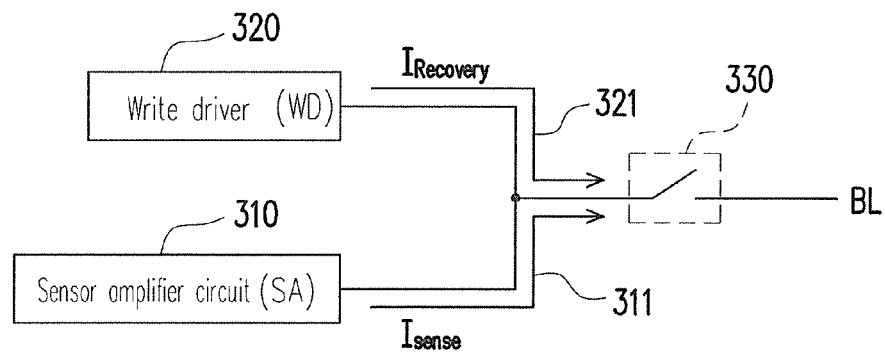
FIGS. 3A and 3B are circuit schematic diagrams illustrating a conventional write mechanism of compensating a resistance drift.
Figure 3B:
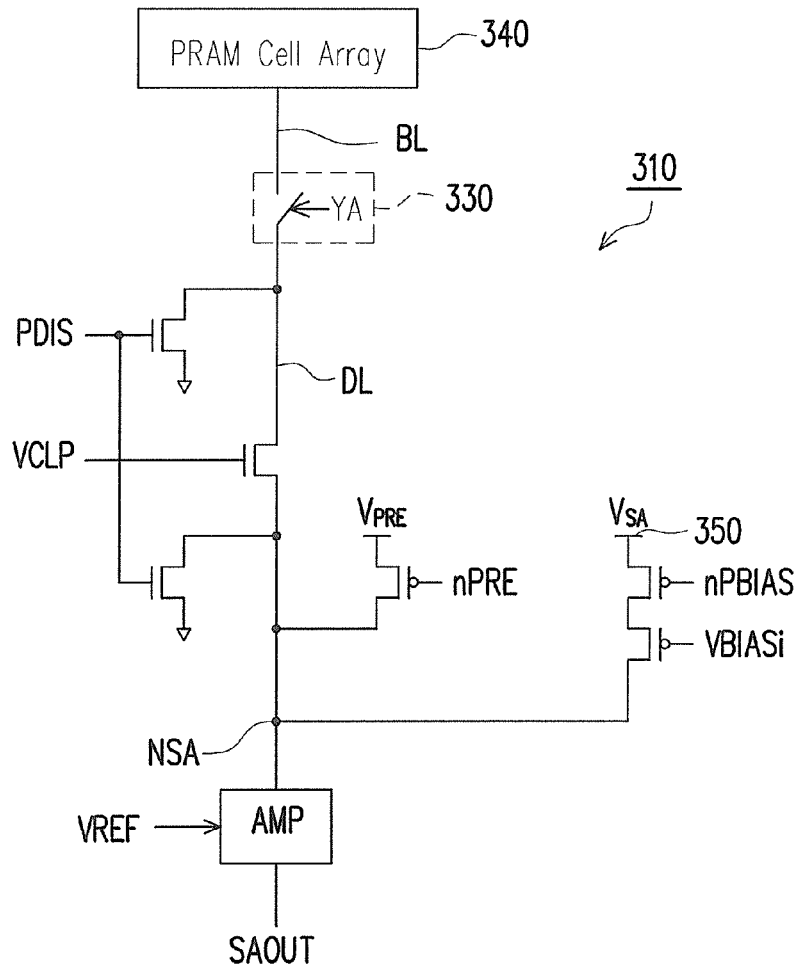
Figure 4A:
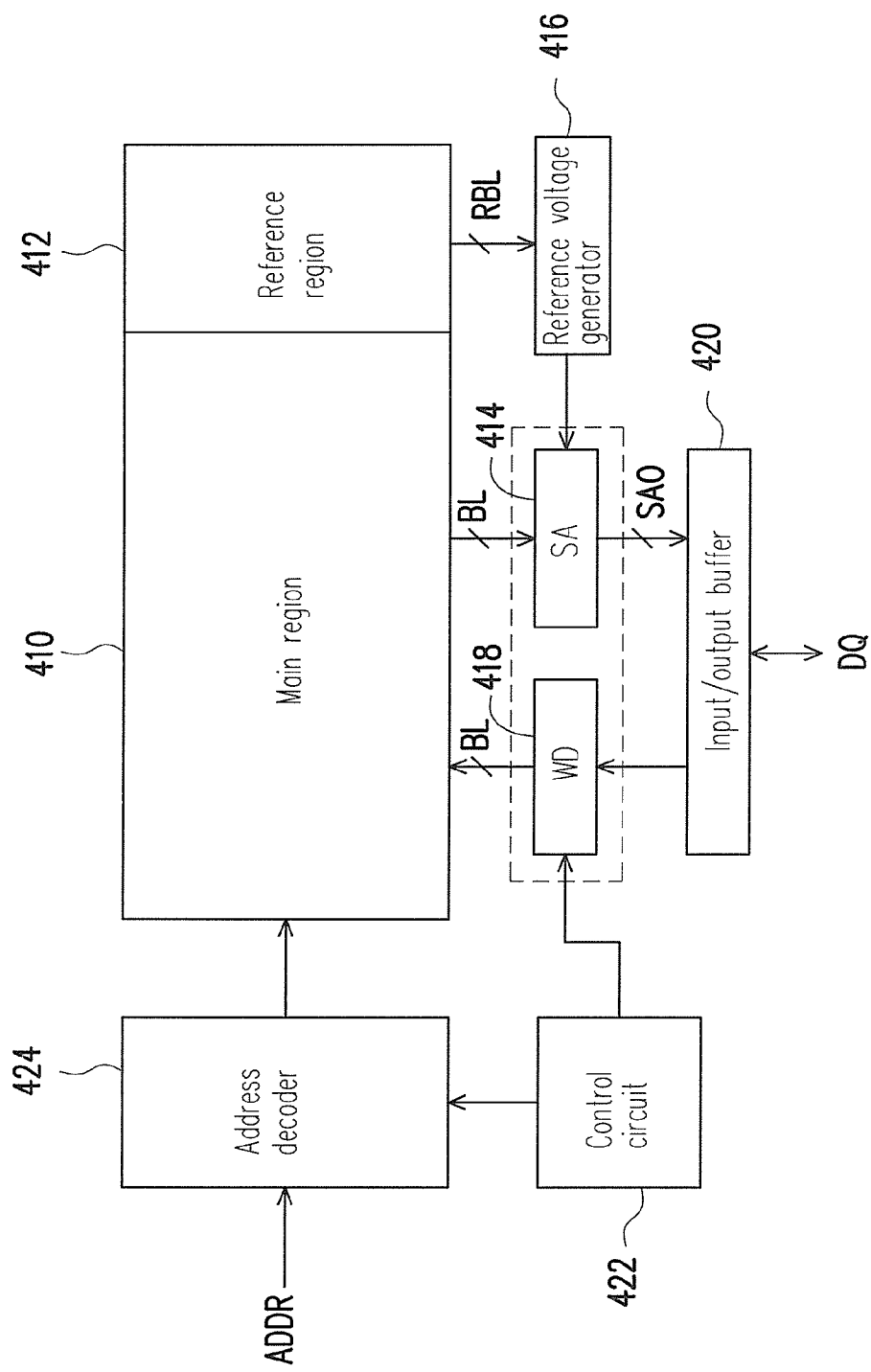
FIG. 4A is a block schematic diagram illustrating a conventional multi-level PCM device.
Figure 5:
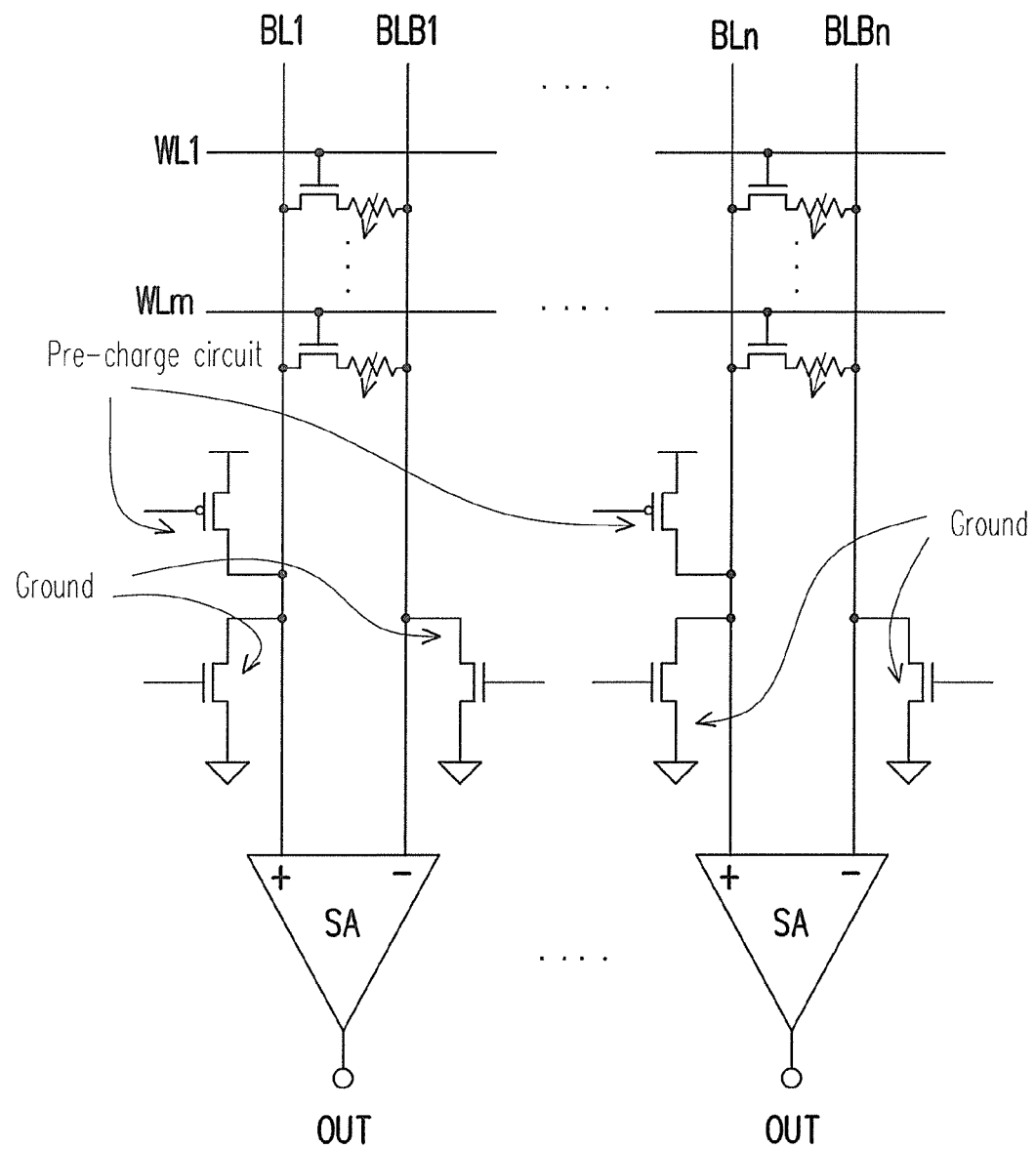
FIG. 5 is a circuit structural diagram illustrating a read circuit of a conventional PCM.
Figure 6:
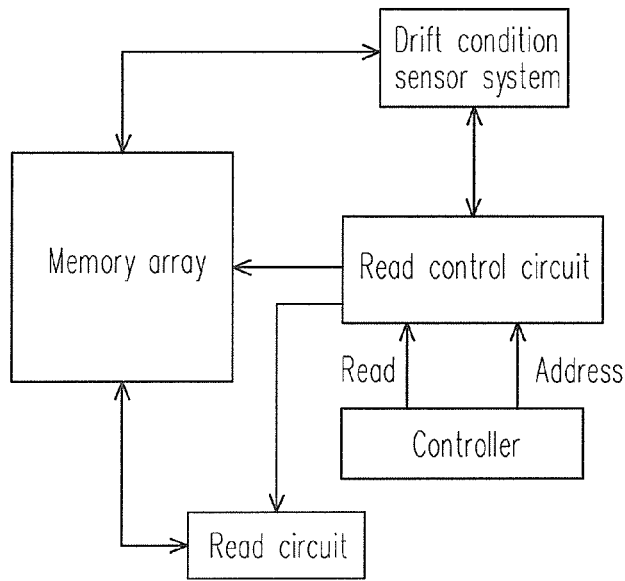
FIG. 6 is a circuit structural diagram illustrating a memory device having a drift compensation function.

Reference will now be made in detail to the present preferred embodiments of the invention, examples of which are illustrated in the accompanying drawings. Wherever possible, the same reference numbers are used in the drawings and the description to refer to the same or like parts.

In one of exemplary embodiments, a memory device having a drift compensation function and an operation method thereof are introduced herein. If data stored in memory cell is not accessed for a long period of time, a resistance of the memory cell may be increased, and such characteristic may cause a problem of read error for a multi-level and high-impedance state read operation, for example, in one of exemplary embodiments, the read operation of a phase change memory (PCM) or a multi-level cell (MLC) flash memory, resistive random access memory (RRAM), etc. Therefore, a compensation mechanism may be required to resolve to resolve the problem of read error.

Figure 7:
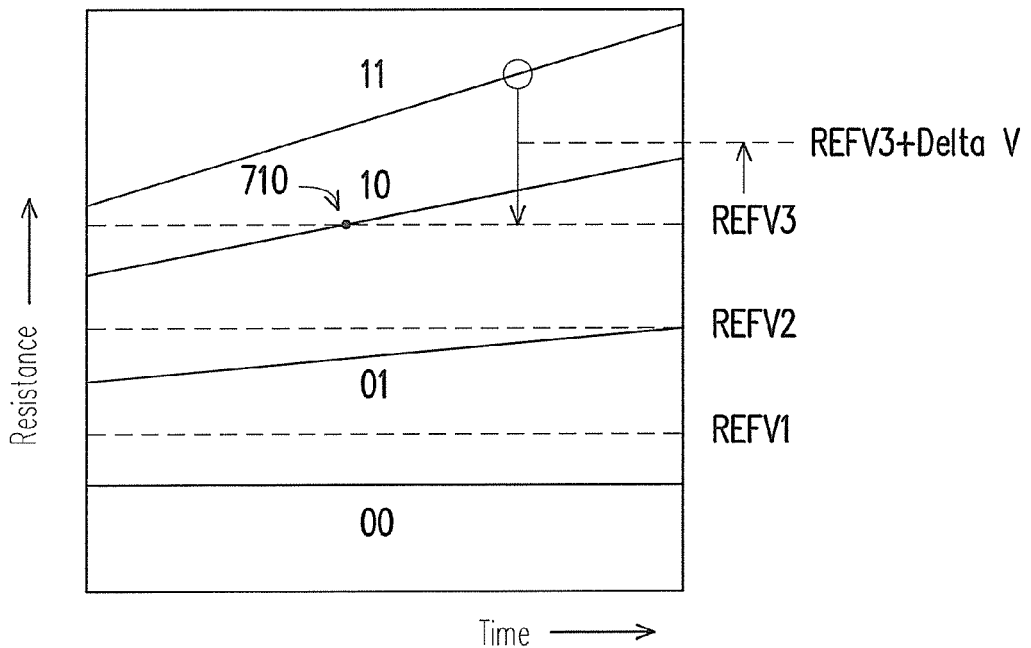
FIG. 7 is an operational schematic diagram of a drift compensation mechanism according to an embodiment of the present invention.

FIG. 7 is an operational schematic diagram of a drift compensation mechanism according to one of exemplary embodiments. Referring to FIG. 7, in the memory device, a multi-level storage memory for storing two bits is taken as an exemplary embodiment for illustration; however, it is not limited thereto. A multi-level storage memory for storing more than two bits can also be applied thereto. Moreover, in the memory device, when data is written into a block, a corresponding reference cell is also found out. The reference cell may be used for providing a voltage difference to a reference voltage provided from external to serve as a reference basis to read the block, so that the stored multi-level bits can be obtained according to a resistance state of the memory cell. Namely, such voltage difference may be a resistance drift information of the reference cell that is caused by a long idle time thereof. Such information is added to the reference voltage provided from the external to obtain a new reference voltage for determination.

As shown in FIG. 7, data stored in the multi-level storage memory with two bits includes "00", "01", "10" and "11", and three reference voltages REFV1, REFV2 and REFV3 are used for reading data of the stored bits.

According to FIG. 7, it is known that when the memory cell is not accessed for a long period of time, the resistance thereof is drifted upwards. At a time point 710, since the resistance is drifted upwards, the stored bit data "10" is misjudged to be "11". In the drift compensation mechanism of the embodiment, when a power supply is provided to activate the memory device to access data, an internal circuit of the memory device first subtracts a reference voltage REFV from a voltage generated by the drifted resistance to obtain a voltage difference, and then adds the voltage difference to an original reference voltage, so that a new reference voltage is equal to the original reference voltage plus the voltage difference. Then, a determination is performed to carry on a correct read operation.

As shown in FIG. 7, regarding the reference voltage REFV3 used for determining resistance states of the bit data "11" and "10", the reference voltage REFV3 is first subtracted from a voltage corresponding to the resistance state "11" to obtain a difference Delta V. Then, the difference Delta V is added to the reference voltage REFV3, to serve as the reference voltage for determining the resistance states of bit data "11" and "10". The difference Delta V can be used to adjust a size of a MOS transistor used in the drift compensation mechanism as long as a slope of the increased resistance generated due to the long idle time is obtained, so as to obtain an error value for accomplishing the compensation.

According to the drift compensation mechanism in one of exemplary embodiments, when the memory cell of the memory device is read, the reference voltage is increased according to variation of characteristics of the drift resistance of the reference cell. The increased value of the reference voltage (i.e. the voltage difference) corresponds to the resistance variation caused by the drift condition. The drift compensation mechanism of the embodiment is adapted to a compensation circuit of a read driver of the memory device, which can compensate the variation of the voltage level when data is read from the memory cell. When the resistance drift occurs, a drift amount is first calculated, and then the drift amount is added to the reference voltage, in order to avoid the error in judgement caused by the resistance drift when the stored data is read.

Figure 8A:
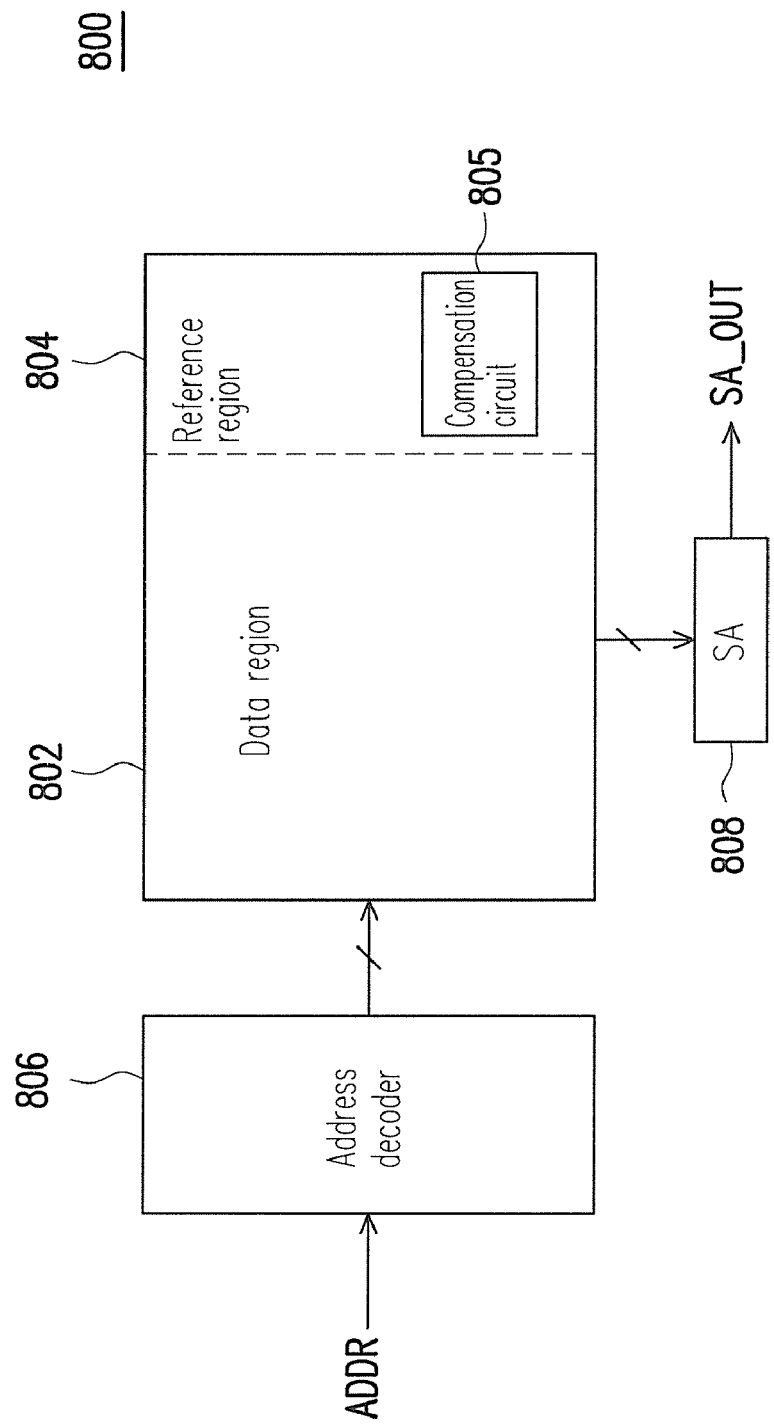
FIG. 8A is a block schematic diagram illustrating a memory device having a drift compensation function.
Figure 8B:
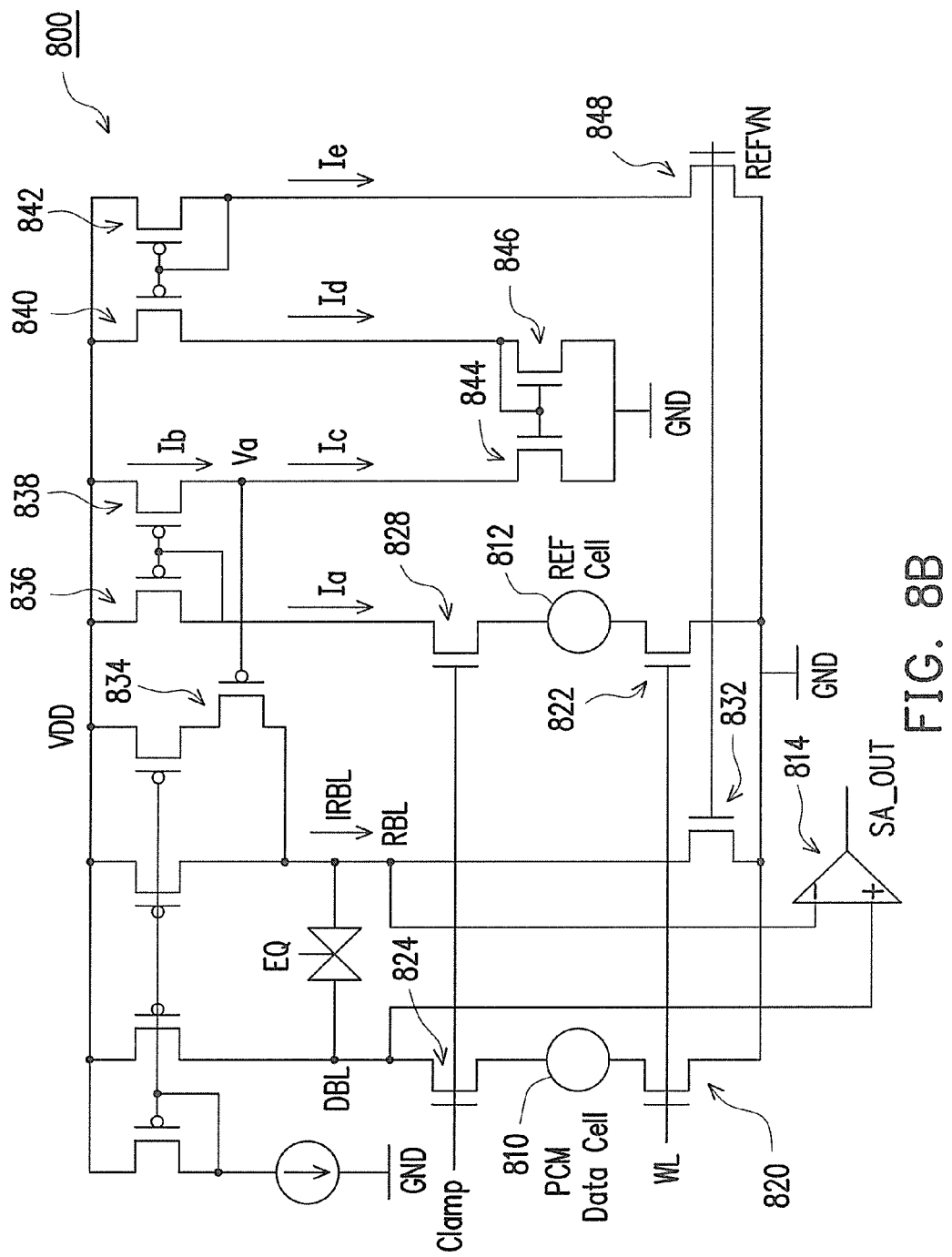
FIG. 8B is a detailed circuit diagram illustrating a memory device having a drift compensation function according to an embodiment of the present invention.

One of exemplary embodiments is shown as FIG. 8A and FIG. 8B. In the embodiment, a memory device has a drift compensation function is introduced for illustration. FIG. 8A is a block schematic diagram illustrating a memory device having a drift compensation function in the exemplary embodiment. The memory device 800 includes at least a data region 802 and a reference region 804 of a memory array region. The reference region 804 may include a compensation circuit 805. The reference region 804 is used for providing different reference voltages during a read operation, so as to read the data stored in the cells of the multi-level memory arranged in the data region 802. The compensation circuit 805 may also be an independent circuit design. The memory device 800 further includes an address decoder 806 and a sensor amplifier circuit 808. The address decoder 806 receives an address signal ADDR for accessing the memory cells in the memory array region. The memory device 800 further includes a write driver, an input/output buffer and a control circuit, etc. In the exemplary embodiment, the circuit related to the reading operation are described.

FIG. 8B is a detailed circuit diagram illustrating the memory device having the drift compensation function. In the embodiment, a multi-level phase change memory (PCM) is taken as an exemplary embodiment, but it is not limited thereto. In the memory device 800, the memory array region includes an array formed by a plurality of PCM data cells. The memory array region is divided into the data region 802 and the reference region 804. Assuming that after the address signal ADDR is decoded by the address decoder 806, a specific word line (shown as "WL" in FIG. 8B) and a bit line (BL) are selected to perform the read operation, and a PCM data cell 810 in the memory array region corresponds to the address signal ADDR. A reference cell 812 provides a reference voltage to serve as a basis of the read operation performed to the PCM data cell 810. As shown in FIG. 7, data stored in the multi-level storage memory with two bit data includes "00", "01", "10" and "11", and three reference voltages REFV1, REFV2 and REFV3 are used for defining the stored bit values. The read operation is performed according to the reference voltage provided by the reference cell 812, and a read result thereof is transmitted to a sensor amplifying unit 814 in the sensor amplifier circuit 808, so as to output a sensing result SA_OUT.

Transistors 824 and 828 are coupled to a clamp control signal (Clamp). The transistor 824 is used for controlling a connection state of a data bit line (DBL) and the PCM data cell 810. After the DBL and a reference bit line (RBL) are pre-charged by an equalization circuit EQ, the transistors 824 and 828 can be activated in response to the clamp control signal Clamp. The RBL is further connected to a current source VDD through a transistor 834. The transistor 834 is used for increasing a voltage value of the RBL according to an increased resistance value caused by the drift condition.

As shown in FIG. 8B, according to the drift compensation mechanism of the exemplary embodiment, when the voltage of the DBL is different from the voltage of the RBL, a corresponding voltage difference is applied to the RBL through a plurality of current mirror circuits, so as to adjust the reference voltage to avoid the problem of read errors. Such drift compensation mechanism is, for example, achieved by transistors 834, 836, 838, 840, 842, 844, 846 and 848.

As shown in FIG. 8B, the reference cell 812 generates a current Ia, and the current Ia is mapped by a current mirror (consists of transistors 836 and 838) to generate a current Ib.

The reference transistor (REFVN) 848 generates a current Ie, and the current Ie is mapped by current mirrors (formed by transistors 840 and 842, and transistors 844 and 846) to generate currents Id and Ic. When a resistance of the reference cell 812 is 0 during the write operation, the current Ia is relatively great, and the current Ic is relatively small, so that a voltage Va is increased to turn off the compensation transistor 834, and the data cell 810 is discriminated. After the power supply is turned off for a period of time, the read operation is performed. Now, the resistance of the reference cell 812 is increased, so that the current Ia is reduced. Meanwhile, the current Ib is less than the current Ic, and the compensation transistor 834 is turned on to couple the RBL to the current source VDD, so that the voltage of the RBL is increased, and then the data cell 810 is discriminated.

After the compensation transistor 834 is turned on, a voltage $\Delta V$ is input to a gate of the compensation transistor 834, which is substantially equivalent to a situation of inputting a current $\Delta I$ to the RBL. After the current $\Delta I$ is added to an original reference current I, an obtained current flows into the reference cell 812. Then, the reference cell 812 generates a new compensated reference voltage to the sensor amplifying unit 814 for comparison. The compensated voltage difference can be used to adjust sizes of the transistors 834, 836, 838, 840 and 842 as long as a slope of the increased resistance generated due to the long idle time is obtained, so as to obtain an error value for successfully compensate the reference voltage.

Figure 8C:
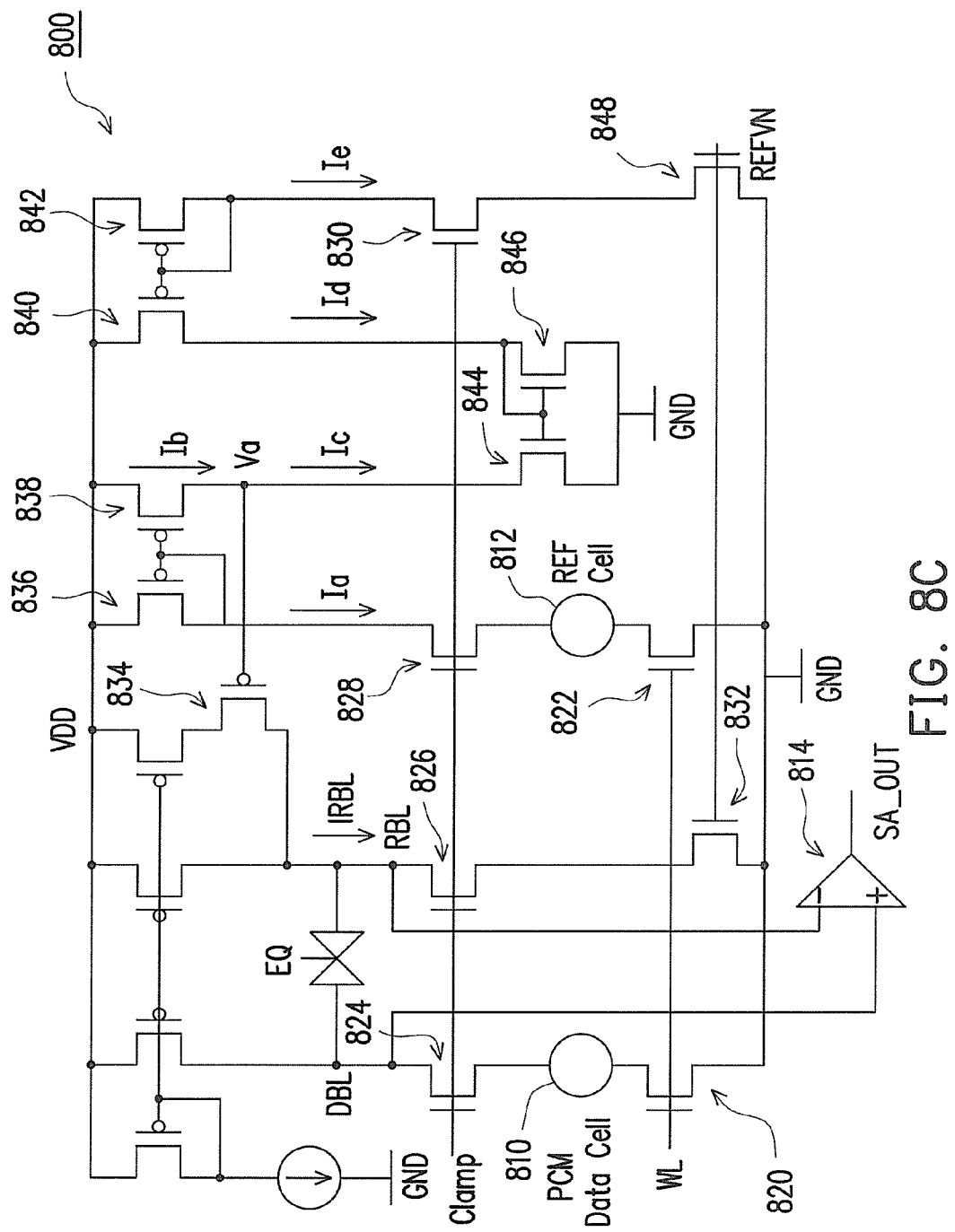
FIG. 8C is a detailed circuit diagram illustrating a memory device having a drift compensation function according to another embodiment of the present invention.

FIG. 8C is a detailed circuit diagram illustrating the memory device having the drift compensation function according to another one of exemplary embodiments. The drift compensation mechanism of the embodiment is similar to that of the embodiment of FIG. 8B, so that the same reference numerals refer to the same elements, and detailed descriptions thereof are not repeated. A difference between the two embodiments may be that the transistors 828 and 830 are connected to the clamp control signal Clamp.

The clamp control signal Clamp may be used for controlling the transistors 824, 826, 828 and 830. As described above, the transistor 824 is used for controlling the connection state of the DBL and the PCM data cell 810. The transistor 826 is used for activating the RBL. After the DBL and the RBL are pre-charged by the equalization circuit EQ, the transistors 824, 826, 828 and 830 can be activated in response to the clamp control signal Clamp to achieve the drift compensation function.

Figure 9A:
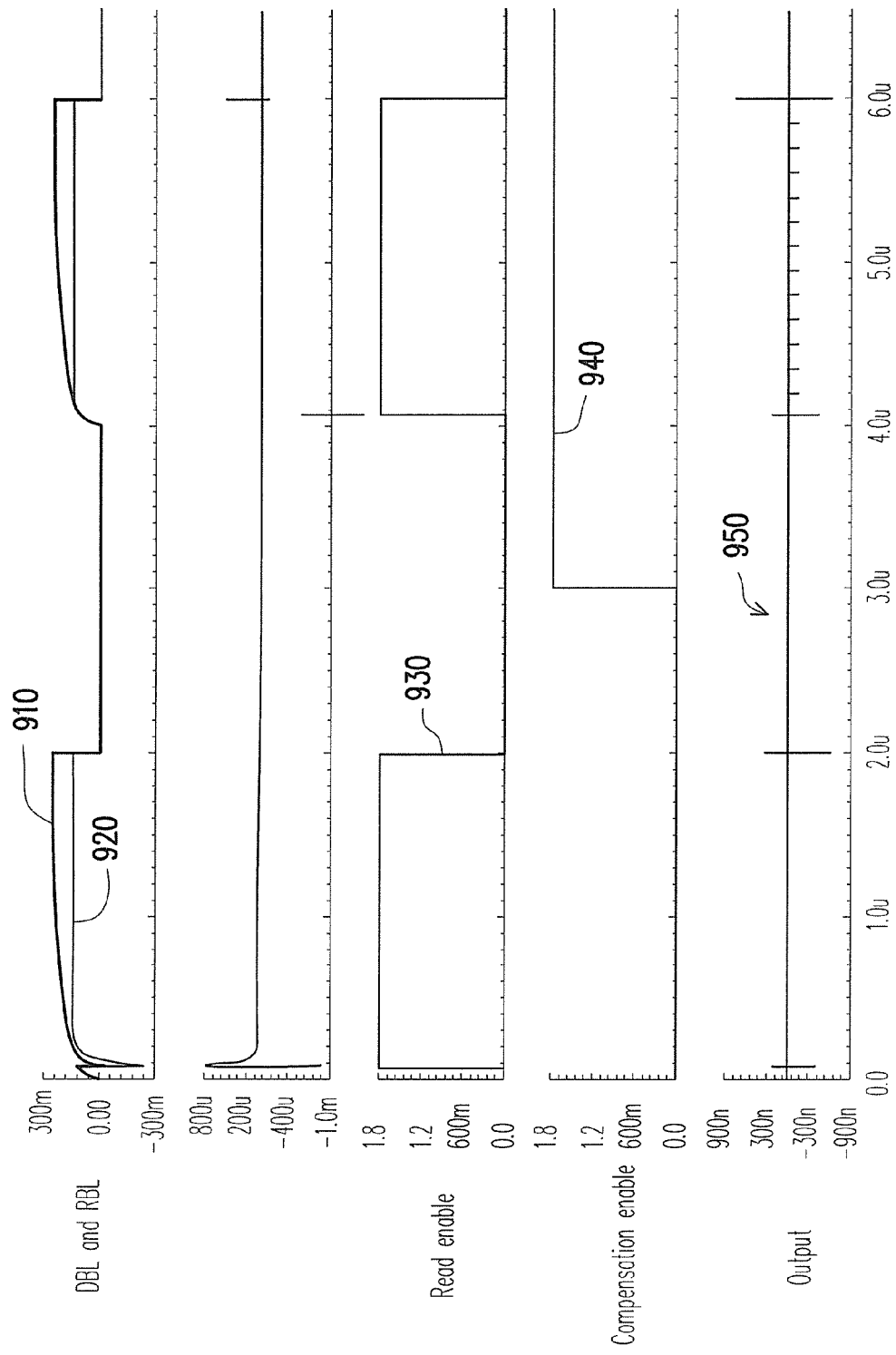
FIGS. 9A and 9B are timing diagrams of read signals of a memory device having a drift compensation function according to an embodiment of the present invention.
Figure 9B:
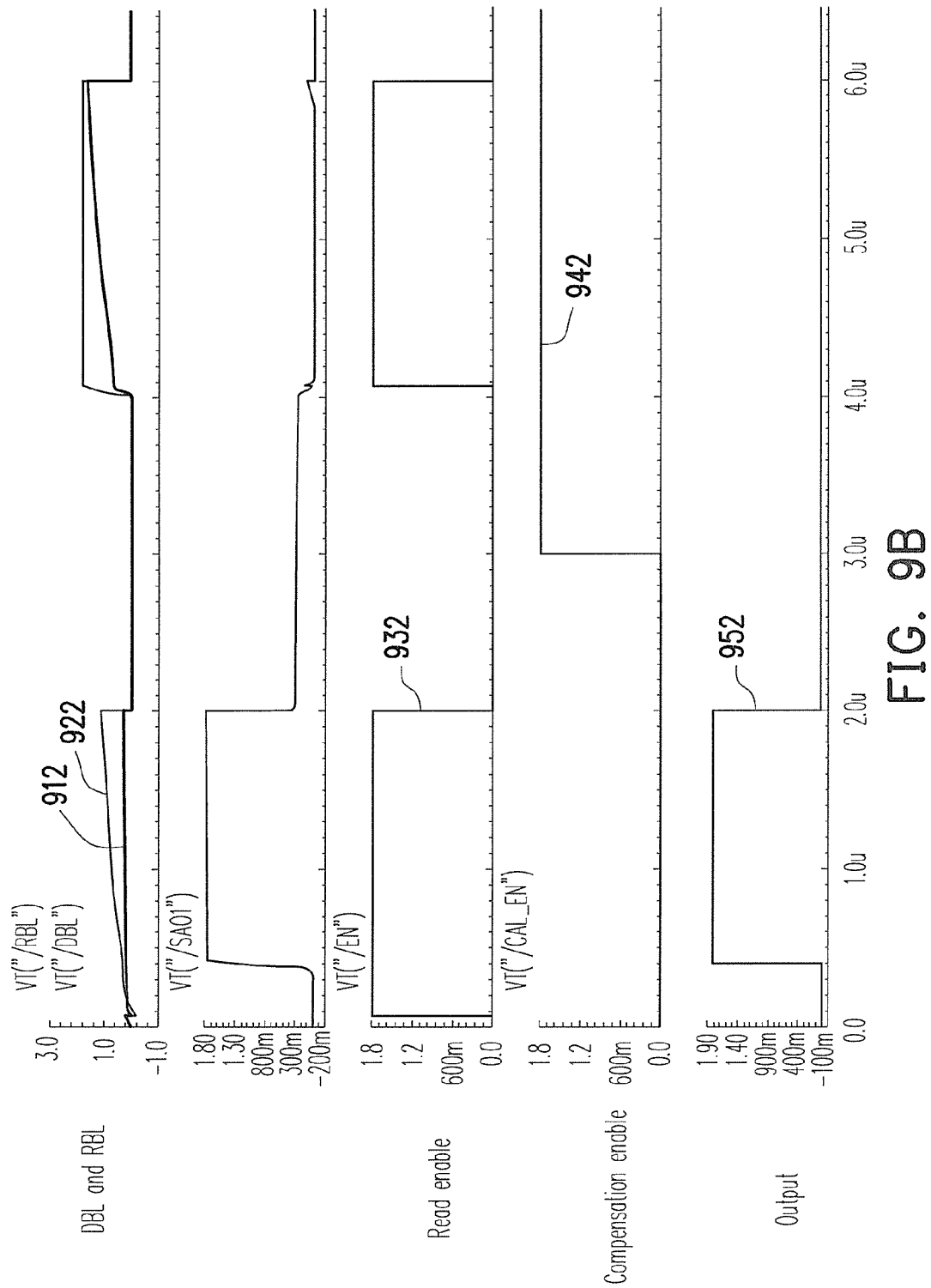

Accessing of the memory device can be described below with reference of FIG. 9A and FIG. 9B. FIG. 9A is a timing diagram of read signals of the memory device. Assuming the data bit data "10" is written into the memory cell, a resistance of the memory cell is 1 mega ohms (M$\Omega$), and the memory cell is accessed according to the timing diagram of FIG. 9 with reference of the referential numbers of FIG. 8. When the data cell 810 has the state of "10", a voltage (shown as a referential number 920) of the DBL is less than a voltage (shown as a referential number 910) of the RBL. Now, when a read enable signal Read_EN is enabled for detecting, an output result thereof is shown as a referential number 950, which has a correct logic low level, so that the output result is correct. Now, since a time interval between the write operation and the read operation is small, the problem of misjudgment caused by the resistance drift is not liable to be occurred. Therefore, regardless of whether the compensation mechanism of the present embodiment is activated (shown as a referential number 940), the output result still has the correct logic low level, which represents that the problem of misjudgment is not occurred under normal operations.

After a period of idle time, the resistance of the memory cell is drifted upwards. Referring to FIG. 9B, the circuit is normally detected, namely, the read operation is performed after the write operation of the memory cell is completed. When the data cell 810 has the state of "10", after a period of idle time, the resistance thereof is increased from 1 M$\Omega$ to 2 M$\Omega$, and the voltage (shown as a referential number 922) of the DBL is greater than the voltage (shown as a referential number 912) of the RBL. Now, when the read enable signal Read_EN is enabled for detecting, an output result thereof is shown as a referential number 952, which is an error logic high level, and is not the correct logic low level. Such problem is caused by the resistance drift due to the period of idle time. After the compensation mechanism of the embodiment is activated (shown as a referential number 942), the output result is converted to be the correct logic low level, so that the problem of misjudgment caused by the resistance drift can be effectively compensated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
   at least one data cell, for storing multi-level data;
   at least one reference cell, for providing a reference voltage;
   a pair of bit lines, corresponding to the data cell, wherein the pair of bit lines comprises a data bit line and a reference bit line, and the data bit line is connected to the data cell; and
   a compensation circuit, connected to the reference cell, the reference cell providing information of resistance varied along with time, and the compensation circuit generating a compensation voltage according to the information provided by the reference cell to apply to the reference voltage, thereby a result as the stored data of the data cell is sensed according to the reference voltage compensated by the compensation voltage.

2. The memory device as claimed in claim 1, further comprising a sensor amplifier circuit, connected to the data bit line and the reference bit line, to sense voltages of the data bit line and the reference bit line, wherein the voltage of the reference bit line is the reference voltage compensated by the compensation voltage, the sensor amplifier circuit outputs the result as the stored data of the data cell.

3. The memory device as claimed in claim 1, wherein the compensation voltage is generated according to the resistance varied along with time of the reference cell, in which a mapping relationship exists between the resistance varied and the generated compensation voltage.

4. The memory device as claimed in claim 1, wherein the compensation circuit comprises:
   a first current mirror, having a source terminal coupled to the reference cell, and a mapping terminal coupled to a comparison terminal, for mapping a current flowing through the reference cell to the mapping terminal to generate a first current;
   a second current mirror, having a source terminal coupled to a reference voltage control switch, for generating a second current when the reference voltage control switch is turned on; and
   a third current mirror, having a source terminal coupled to a mapping terminal of the second current mirror for connecting a third current generated by mapping the second current, and a mapping terminal coupled to the comparison terminal for generating a fourth current, wherein the fourth current is the reference current and is coupled to the comparison terminal, the comparison terminal is used for controlling the voltage compensation switch, when the first current is less than the reference current, the voltage compensation switch is turned on, and a voltage difference is compensated to the reference voltage on the reference bit line corresponding to the selected data cell.

5. The memory device as claimed in claim 1, wherein the data cells are phase change memory cells.

6. The memory device as claimed in claim 1, wherein the data cells are flash memory cells.

7. The memory device as claimed in claim 1, wherein the data cells are resistive random access memory (RRAM) cells.

8. The memory device as claimed in claim 1, further comprising an address decoder for receiving an address signal, and performing decoding according to the address signal, so as to select the data cell and the reference cell.

9. The memory device as claimed in claim 1, wherein the reference voltage is an external voltage plus the compensation voltage.

10. The memory device as claimed in claim 1, further comprising a control circuit for receiving a control signal to serve as a basis of starting an operation of accessing the data cell.

11. A voltage compensation circuit, adapted to a read device of a multi-level memory device, wherein the multi-level memory device comprises a plurality of data cells for storing multi-level data, wherein stored data of each of the data cells is read by comparing a reference voltage, and the read device comprises a plurality of reference cells, the voltage compensation circuit comprising:
a first current mirror, having a source terminal coupled to one of the reference cells, and a mapping terminal coupled to a comparison terminal, to map a current flowing through the reference cell to the mapping terminal to generate a first current;
a second current mirror, having a source terminal coupled to a reference voltage control switch, to generate a second current when the reference voltage control switch is turned on; and
a third current mirror, having a source terminal coupled to a mapping terminal of the second current mirror to connect a third current generated by mapping the second current, and a mapping terminal coupled to the comparison terminal generating a fourth current for coupling to the comparison terminal, wherein the comparison terminal is used for controlling a voltage compensation switch, when the first current is less than the fourth current, the voltage compensation switch is turned on, and a voltage difference is compensated to a reference voltage corresponding to the data cell to be read.

12. The voltage compensation circuit as claimed in claim 11, wherein when the voltage difference is compensated to the reference voltage, in case that a resistance of the reference cell is increased along with time, a current variation generated when the reference cell is conducted is compared to the fourth current to turn on the voltage compensation switch, so as to perform a voltage compensation.

13. The voltage compensation circuit as claimed in claim 11, wherein the data cells are phase change memory cells.

14. The voltage compensation circuit as claimed in claim 11, wherein the data cells are flash memory cells.

15. The voltage compensation circuit as claimed in claim 9, wherein the data cells are RRAM memory cells.

16. A voltage compensation method for reading a multi-level memory device, wherein the multi-level memory device comprises a plurality of data cells for storing multi-level data, wherein stored data of each of the data cells is read by comparing a reference voltage, and the read device comprises a plurality of reference cells, voltage compensation method for reading the multi-level memory device comprising:
providing a power supply to activate the multi-level memory device to perform reading;
selecting one of the data cells to read stored data, and correspondingly selecting one of the reference cells;
mapping a current passing through the reference cell to generate a first current for coupling to a comparison terminal;
turning on a reference voltage control switch to generate a second current when the reading is to be performed; and
mapping the second current to generate a third current, and mapping the third current to generate a fourth current for coupling to the comparison terminal, wherein the comparison terminal is coupled to a voltage compensation switch, and when the first current is less than the fourth current, the voltage compensation switch is turned on, and a voltage difference is compensated to a reference voltage corresponding to the data cell to be read.

17. The voltage compensation method for reading the multi-level memory device as claimed in claim 16, wherein when the voltage difference is compensated to the reference voltage, in case that a resistance of the reference cell is increased along with time, a current variation generated when the reference cell is conducted is compared to the fourth current to turn on the voltage compensation switch, so as to perform a voltage compensation.

18. The voltage compensation method for reading the multi-level memory device as claimed in claim 16, further comprising receiving a control signal to serve as a basis of starting an operation of accessing the data cell.

* * * * *